(12) United States Patent
Kimura

(10) Patent No.: US 12,413,203 B2
(45) Date of Patent: Sep. 9, 2025

(54) ACOUSTIC WAVE DEVICE

(71) Applicant: Murata Manufacturing Co., Ltd., Nagaokakyo (JP)

(72) Inventor: Tetsuya Kimura, Nagaokakyo (JP)

(73) Assignee: MURATA MANUFACTUING CO., LTD., Kyoto (JP)

(*) Notice: Subject to any disclaimer, the term of this patent is extended or adjusted under 35 U.S.C. 154(b) by 210 days.

(21) Appl. No.: 18/143,235

(22) Filed: May 4, 2023

(65) Prior Publication Data

US 2023/0275562 A1 Aug. 31, 2023

Related U.S. Application Data

(63) Continuation of application No. PCT/JP2021/041209, filed on Nov. 9, 2021.
(Continued)

(51) Int. Cl.
*H03H 9/13* (2006.01)
*H03H 9/02* (2006.01)
(Continued)

(52) U.S. Cl.
CPC ........ *H03H 9/132* (2013.01); *H03H 9/02031* (2013.01); *H03H 9/02228* (2013.01);
(Continued)

(58) Field of Classification Search
CPC ............... H03H 9/132; H03H 9/02031; H03H 9/02228; H03H 9/174; H03H 9/175;
(Continued)

(56) References Cited

U.S. PATENT DOCUMENTS 10,491,192 B1 11/2019 Plesski et al.
2014/0145556 A1 5/2014 Kadota
(Continued)

FOREIGN PATENT DOCUMENTS

WO 2013021948 A1 2/2013
WO 2016208236 A1 12/2016
WO 2018198654 A1 11/2018

OTHER PUBLICATIONS

International Search Report in PCT/JP2021/041209, mailed Feb. 1, 2022, 3 pages.
(Continued)

*Primary Examiner* — Jorge L Salazar, Jr.
(74) *Attorney, Agent, or Firm* — Keating & Bennett, LLP

(57) ABSTRACT

An acoustic wave device includes a support, a piezoelectric layer on the support, and an IDT electrode including first and second electrode fingers. When a thickness of the piezoelectric layer is d and a center-to-center distance of the first and second electrode fingers adjacent to each other is p, d/p is less than or equal to about 0.5. When an imaginary line connecting tips of the first electrode fingers is an envelope, a direction in which the envelope extends and the direction of the Y-axis intersect each other, and about $9° \leq |\alpha| \leq$ about $14°$ is satisfied, where $|\alpha|$ is an absolute value of a slant angle $\alpha$. The slant angle $\alpha$ is an angle of a corner defined by the direction in which the envelope extends and the direction of the Y-axis and is an angle other than $0°$.

19 Claims, 12 Drawing Sheets

Related U.S. Application Data

(60) Provisional application No. 63/112,248, filed on Nov. 11, 2020.

(51) Int. Cl.
    *H03H 9/17*     (2006.01)
    *H03H 9/56*     (2006.01)

(52) U.S. Cl.
    CPC ............ *H03H 9/174* (2013.01); *H03H 9/175* (2013.01); *H03H 9/176* (2013.01); *H03H 9/562* (2013.01); *H03H 9/564* (2013.01); *H03H 9/568* (2013.01)

(58) Field of Classification Search
    CPC ........ H03H 9/176; H03H 9/562; H03H 9/564; H03H 9/568; H03H 9/14547; H03H 9/14558; H03H 9/14594
    USPC ................................ 333/187, 188, 193–196
    See application file for complete search history.

(56) References Cited

U.S. PATENT DOCUMENTS

| | | |
|---|---|---|
| 2018/0102755 A1 | 4/2018 | Takamine |
| 2020/0021271 A1* | 1/2020 | Plesski ..................... H03H 9/02 |
| 2020/0036357 A1 | 1/2020 | Mimura |

OTHER PUBLICATIONS

Written Opinion in PCT/JP2021/041209, mailed Feb. 1, 2022, 4 pages.

\* cited by examiner

ACOUSTIC WAVE DEVICE

CROSS REFERENCE TO RELATED APPLICATIONS

This application claims the benefit of priority to Provisional Application No. 63/112,248 filed on Nov. 11, 2020 and is a Continuation Application of PCT Application No. PCT/JP2021/041209 filed on Nov. 9, 2021. The entire contents of each application are hereby incorporated herein by reference.

BACKGROUND OF THE INVENTION

1. Field of the Invention

The present invention relates to an acoustic wave device.

2. Description of the Related Art

Acoustic wave devices have been widely used in filters of mobile phones and the like. In recent years, an acoustic wave device, such as that described in U.S. Pat. No. 10,491,192, that uses bulk waves in a thickness shear mode has been described. In this acoustic wave device, a pair of electrodes are provided on a piezoelectric layer. The pair of electrodes face each other on the piezoelectric layer and are connected to different potentials. An alternating-current voltage is applied between the electrodes, thereby exiting bulk waves in a thickness shear mode.

In an acoustic wave device that uses bulk waves in a thickness shear mode, when Z-cut LiNbO$_3$ is used as a piezoelectric layer, it is not always possible to obtain sufficient resonance characteristics.

SUMMARY OF THE INVENTION

Preferred embodiments of the present invention provide acoustic wave devices that each obtain satisfactory resonance characteristics.

An acoustic wave device according to a preferred embodiment of the present invention to be connected between a first signal end and a second signal end of a filter device, the acoustic wave device including a support, a piezoelectric layer on the support, the piezoelectric layer including an X-axis, a Y-axis, and a Z-axis that are crystal axes and being made of Z-cut lithium niobate, and an IDT electrode on the piezoelectric layer, wherein the IDT electrode includes a first busbar and a second busbar that face each other, a plurality of first electrode fingers each including one end connected to the first busbar, and a plurality of second electrode fingers each including one end connected to the second busbar and being interdigitated with the plurality of first electrode fingers, d/p is less than or equal to about 0.5, where d is a thickness of the piezoelectric layer and p is a center-to-center distance of the first electrode fingers and the second electrode fingers adjacent to each other, a direction in which an envelope extends and a direction of the Y-axis intersect each other, the envelope being an imaginary line connecting tips of the plurality of first electrode fingers, and about 9°≤|α|≤about 14° is satisfied, where |α| is an absolute value of a slant angle α, the slant angle α being an angle of a corner that is formed by the direction in which the envelope extends and the direction of the Y-axis and being an angle other than 0°.

An acoustic wave device according to a preferred embodiment of the present invention to be connected between a ground potential and a connection point between a first signal end and a second signal end of a filter device, the acoustic wave device including a support, a piezoelectric layer on the support, the piezoelectric layer including an X-axis, a Y-axis, and a Z-axis that are crystal axes and being made of Z-cut lithium niobate, and an IDT electrode on the piezoelectric layer, wherein the IDT electrode includes a first busbar and a second busbar that face each other, a plurality of first electrode fingers each including one end connected to the first busbar, and a plurality of second electrode fingers each including one end connected to the second busbar and being interdigitated with the plurality of first electrode fingers, d/p is less than or equal to about 0.5, where d is a thickness of the piezoelectric layer and p is a center-to-center distance of the first electrode fingers and the second electrode fingers adjacent to each other, the plurality of first electrode fingers and the plurality of second electrode fingers extend in a direction perpendicular or substantially perpendicular to a direction of the Y-axis of the piezoelectric layer, and a direction in which an envelope extends and the direction of the Y-axis intersect each other, the envelope being an imaginary line connecting tips of the plurality of first electrode fingers, and |α|<about 9° or about 14°<|α| is satisfied, where |α| is an absolute value of a slant angle α, the slant angle α being an angle of a corner that is defined by the direction in which the envelope extends and the direction of the Y-axis and being an angle other than 0°.

With preferred embodiments of the present invention, satisfactory resonance characteristics are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Preferred embodiments described in the present description are presented as examples, and components in different preferred embodiments can be partially replaced or combined together.

Figure 1:
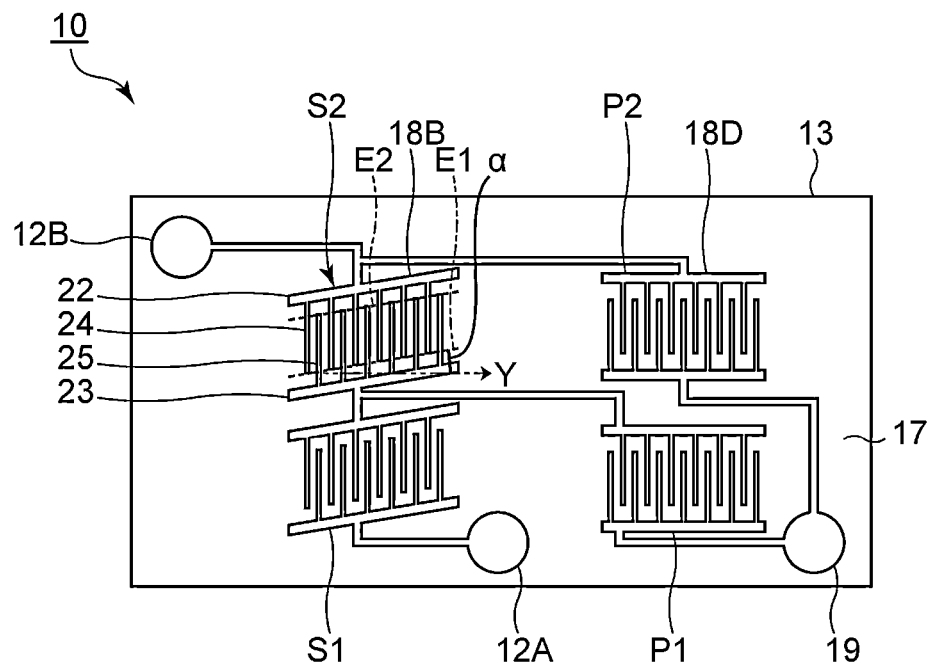
FIG. 1 is a schematic plan view of a filter device according to a first preferred embodiment of the present invention.
Figure 2:
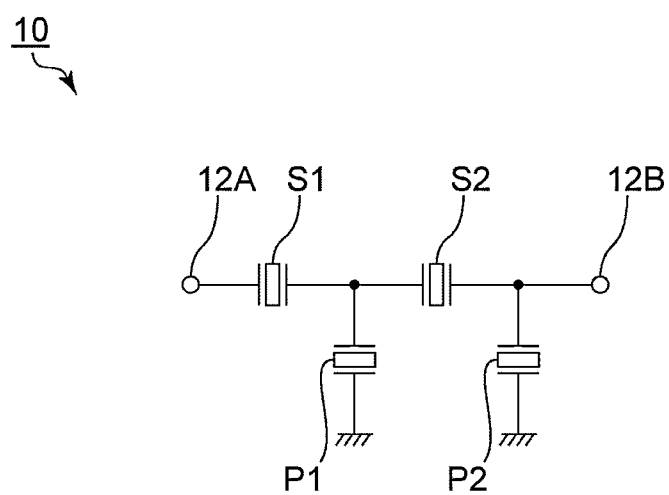
FIG. 2 is a circuit diagram of the filter device according to the first preferred embodiment of the present invention.

FIG. 1 is a schematic plan view of a filter device according to a first preferred embodiment of the present invention. FIG. 2 is a circuit diagram of the filter device according to the first preferred embodiment.

As illustrated in FIG. 1 and FIG. 2, a filter device 10 is, for example, a ladder filter. As illustrated in FIG. 1, the filter device 10 includes a first signal end 12A, a second signal end 12B, a ground end 19, a plurality of series arm resonators, and a plurality of parallel arm resonators. More specifically, the plurality of series arm resonators of the filter device 10 are a series arm resonator S1 and a series arm resonator S2. The plurality of parallel arm resonators are a parallel arm resonator P1 and a parallel arm resonator P2. The first signal end 12A is an input end. The second signal end 12B is an antenna end. The antenna end is connected to an antenna. The ground end 19 is connected to a ground potential.

In the filter device 10, the series arm resonator S1 and the series arm resonator S2 are connected in series to each other between the first signal end 12A and the second signal end 12B. The parallel arm resonator P1 is connected between a connection point between the series arm resonator S1 and the series arm resonator S2 and a ground potential. The parallel arm resonator P2 is connected between the second signal end 12B and a ground potential. In the present preferred embodiment, all of the series arm resonators and all of the parallel arm resonators are, for example, acoustic wave resonators. The series arm resonator S1 is the acoustic wave resonator that is disposed closest to the first signal end 12A. The series arm resonator S2 and the parallel arm resonator P2 are the acoustic wave resonators that are disposed closest to the second signal end 12B. In the present preferred embodiment, the series arm resonator S1 and the series arm resonator S2 are acoustic wave devices according to one preferred embodiment of the present invention. The circuit configuration of the filter device 10 is not limited to that described above. It is sufficient for the filter device 10 to include at least one acoustic wave device according to a preferred embodiment of the present invention. Here, an acoustic wave device is synonymous with an acoustic wave resonator.

The pass band of the filter device 10 is n79. More specifically, the pass band of the filter device 10 is, for example, about 4400 MHz to about 5000 MHz. The pass band of the filter device 10 is, however, not limited to those described above. For example, the pass band of the filter device 10 may be n77 or the like. When the pass band of the filter device 10 is n77, the pass band of the filter device 10 is about 3400 MHz to about 4200 MHz. The filter device 10 is not limited to a ladder filter. Further, the filter device according to the present preferred embodiment may be a transmission filter, may be a reception filter, or may be a composite filter device, such as a duplexer or a multiplexer, for example.

The plurality of acoustic wave resonators share a piezoelectric substrate 13. The piezoelectric substrate 13 includes a piezoelectric layer 17. The piezoelectric layer 17 includes an X-axis, a Y-axis, and a Z-axis that are crystal axes. The piezoelectric layer 17 is made of, for example, Z-cut lithium niobate. In the present description, the Z-cut lithium niobate includes not only lithium niobate having a rotation angle of about 0° but also lithium niobate having a rotation angle of more than or equal to about −10° and less than or equal to about 10°. Further, in the present description, a certain member that is made of a certain material means that the member may include impurities of a minute amount of a degree with which the electrical characteristics of an acoustic wave device and a filter device are not deteriorated.

The acoustic wave resonators each include an IDT electrode. The IDT electrodes are provided on the piezoelectric layer 17. In the present preferred embodiment, the IDT electrodes are each a laminated metal film including, for example, a Ti layer and an Al layer that are laminated on each other. The Ti layer is positioned closer than the Al layer to the piezoelectric layer 17. The materials of the IDT electrodes are, however, not limited to those described above. Alternatively, the IDT electrodes may each include a single layer of a metal film.

The IDT electrode of the series arm resonator S2 is an IDT electrode 18B. The IDT electrode 18B includes a first busbar 22, a second busbar 23, a plurality of first electrode fingers 24, and a plurality of second electrode fingers 25. The plurality of first electrode fingers 24 are periodically disposed. Respective one ends of the plurality of first electrode fingers 24 are connected to the first busbar 22. The plurality of second electrode fingers 25 are periodically disposed. Respective one ends of the plurality of second electrode fingers 25 are connected to the second busbar 23. The plurality of first electrode fingers 24 and the plurality of second electrode fingers 25 are interdigitated with each other.

Hereinafter, the first electrode fingers 24 and the second electrode fingers 25 may be simply referred to as the electrode fingers. When a direction in which the electrode fingers adjacent to each other face each other is defined as an electrode-finger facing direction and a direction in which the plurality of electrode fingers extend is defined as an electrode-finger extending direction, the electrode-finger extending direction is perpendicular or substantially perpendicular to the electrode-finger facing direction in the IDT electrode 18B. Further, the electrode-finger extending direction is perpendicular or substantially perpendicular to the direction of the Y-axis. The relationship among the electrode-finger extending direction, the electrode-finger facing direction, and the direction of the Y-axis is, however, not limited to that described above.

The IDT electrode 18B is an inclined IDT electrode. More specifically, when an imaginary line connecting tips of the plurality of first electrode fingers 24 is defined as a first envelope E1, a direction in which the first envelope E1 extends intersects the electrode-finger facing direction and the direction of the Y-axis. In FIG. 1, the direction of the Y-axis is indicated by the arrow with a dashed double-dotted line. Similarly, when an imaginary line connecting tips of the plurality of second electrode fingers 25 is defined as a second envelope E2, a direction in which the second envelope E2 extends intersects the electrode-finger facing direction and the direction of the Y-axis. In the present preferred embodiment, the first envelope E1 and the second envelope E2 are parallel or substantially parallel to each other. The relationship between the first envelope E1 and the second envelope E2 is, however, not limited to that described above.

Each of the IDT electrodes also includes a first busbar, a second busbar, a plurality of first electrode fingers, and a plurality of second electrode fingers. Also in each of the IDT electrodes, imaginary lines as a first envelope and a second envelope can be provided. Similarly to the series arm resonator S2, the series arm resonator S1 includes an inclined IDT electrode. Meanwhile, the parallel arm resonator P1 and the parallel arm resonator P2 each include a regular IDT electrode. In the regular IDT electrode in the present description, the electrode-finger facing direction, the direction in which the first envelope extends, and the direction in which the second envelope extends are parallel or substantially parallel to each other.

Figure 3:
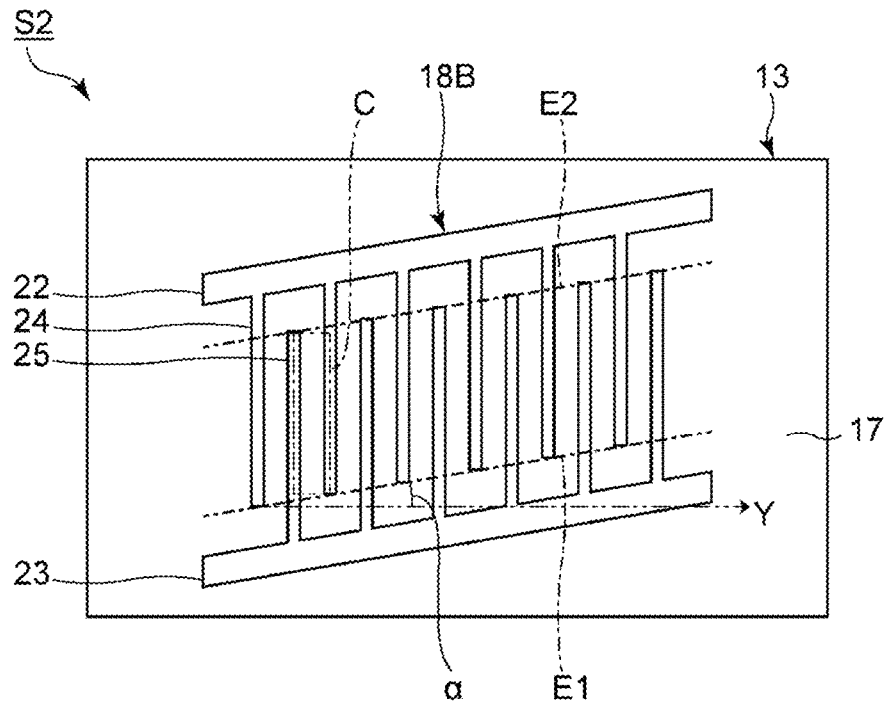
FIG. 3 is a schematic plan view of a series arm resonator in the first preferred embodiment of the present invention.

FIG. 3 is a schematic plan view of a series arm resonator in the first preferred embodiment.

In the IDT electrode 18B of the series arm resonator S2, a region in which the electrode fingers adjacent to each other overlap each other when viewed in the electrode-finger facing direction is an intersection region. The series arm resonator S2 includes a plurality of excitation regions C. Similarly to the intersection region, the excitation regions C are regions in each of which electrode fingers adjacent to each other overlap each other when viewed in the electrode-finger facing direction. The excitation regions C are each a region between a pair of electrode fingers. In more detail, each of the excitation regions C is a region from the center of one of the electrode fingers in the electrode-finger facing direction to the center of the other of the electrode fingers in the electrode-finger facing direction. The intersection region thus includes the plurality of excitation regions C. By applying an alternating-current voltage to the IDT electrode 18B, acoustic waves are excited in the plurality of excitation regions C. In the present preferred embodiment, the series arm resonator S2 is configured to be able to use bulk waves in a thickness shear mode such as, for example, a thickness shear primary mode. Each of the other acoustic wave resonators similarly includes an intersection region and a plurality of excitation regions.

In each of the plurality of acoustic wave resonators, when a thickness of the piezoelectric layer 17 is d and a center-to-center distance of the first electrode fingers and the second electrode fingers adjacent to each other p, d/p is, for example, less than or equal to about 0.5. Consequently, bulk waves in a thickness shear mode are suitably excited. The piezoelectric substrate 13 is a multilayer body, which will be described later in detail, including a support, an electrically insulating layer, and the piezoelectric layer 17. The electrically insulating layer is provided on the support. The piezoelectric layer 17 is provided on the electrically insulating layer. The piezoelectric layer 17, however, may be provided directly on the support. As illustrated in FIG. 1, the plurality of acoustic wave resonators share the same support, the same electrically insulating layer, and the same piezoelectric layer 17. The plurality of acoustic wave resonators, however, may each include a separate support, a separate electrically insulating layer, and a separate piezoelectric layer.

An angle of a corner defined by the direction in which the first envelope extends and the direction of the Y-axis in an acoustic wave resonator is defined as a slant angle α. In particular, in an acoustic wave resonator such as, for example, the series arm resonator S2 including an inclined IDT electrode, the slant angle α is an angle of a corner defined by the direction in which the first envelope extends and the direction of the Y-axis and is an angle other than 0°. The absolute value of the slant angle α is |α|.

As described above, the filter device 10 includes, as the acoustic wave device of the present invention, the series arm resonator S1 and the series arm resonator S2. A feature of the acoustic wave device in the present preferred embodiment is that the absolute value |α| of the slant angle α satisfies, for example, about 9°≤|α|≤about 14°. Consequently, satisfactory resonance characteristics can be obtained. A feature of the filter device 10 in the present preferred embodiment is that at least one acoustic wave resonator is the acoustic wave device in the present invention. Consequently, satisfactory resonance characteristics can be obtained in the resonator included in the filter device 10. Details of this will be described below.

Resonance characteristics were evaluated every time when the slant angle α of the acoustic wave resonator was changed. More specifically, the slant angle α was changed in increments of about 2° in the range from about 0° to about 40°. The design parameters of the acoustic wave resonator were set as follows. Note that the electrode finger pitch described below is a center-to-center distance of electrode fingers adjacent to each other. A distance between tips of electrode fingers and a busbar is defined as an I-B gap. A dimension of the intersection region in the electrode-finger extending direction is defined as an intersection width. The width of an electrode finger is a dimension of the electrode finger in the electrode-finger facing direction.

The layer configuration of the IDT electrode: materials of layers . . . Ti/Al from the piezoelectric layer side, the thicknesses of each layer . . . about 0.05 μm/about 0.5 μm from the piezoelectric layer side the electrode finger pitch: about 3.85 μm the I-B gap: about 5.775 μm the intersection width: about 39.435 μm the width of each electrode finger: about 1.1 μm the number of pairs of electrode fingers: 100 pairs, the Euler Angles (φ, θ, Ψ) of piezoelectric layer: (about 0°, about 0°, about 90°) and the thickness of the piezoelectric layer: about 0.4 μm FIG. 4 is a graph showing a relationship between the slant angle α in an acoustic wave resonator and impedance-frequency characteristics.

Figure 4:
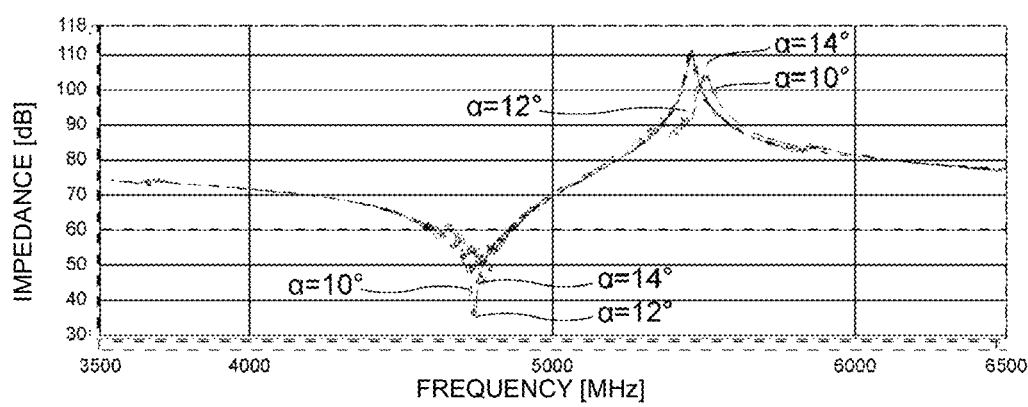
FIG. 4 is a graph showing a relationship between a slant angle α in an acoustic wave resonator and impedance-frequency characteristics.

FIG. 4 shows that, when the slant angle α varies, the impedance in the vicinity of a resonant frequency and in the vicinity of an anti-resonant frequency varies. When about 9°≤|α|≤about 14° is satisfied as in the present preferred embodiment, steep impedance-frequency characteristics can be obtained in the vicinity of the resonant frequency. Accordingly, satisfactory resonance characteristics can be obtained. An acoustic wave resonator in which about 9°≤|α|≤about 14° is satisfied as in the present preferred embodiment is preferably used as a series arm resonator in the filter device 10. Consequently, the filter characteristics of the filter device 10 as a whole can be improved.

Further, resonance characteristics were evaluated every time when the slant angle α of the acoustic wave resonator was changed. More specifically, the slant angle α was changed in increments of about 2° in the range from about −20° to about 20°.

Figure 5:
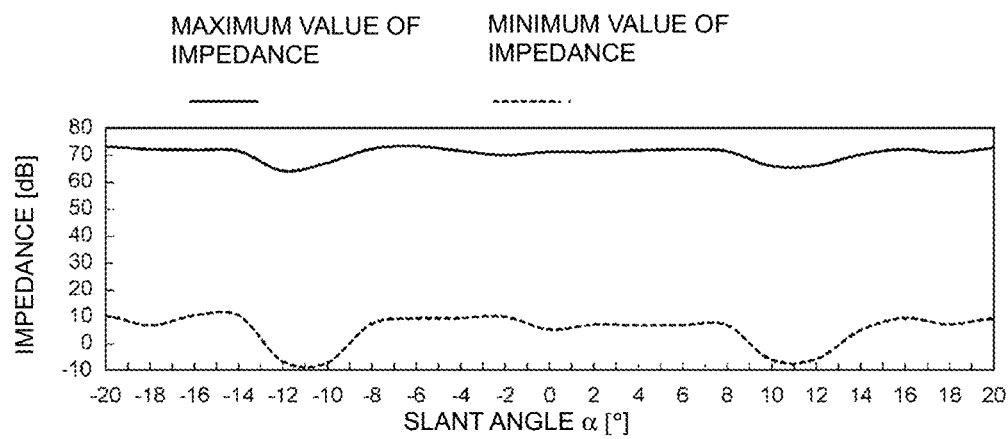
FIG. 5 is a graph showing a relationship between the slant angle α in an acoustic wave resonator and the maximum value and the minimum value of an impedance.

FIG. 5 is a graph showing a relationship between the slant angle α in an acoustic wave resonator and the maximum value and the minimum value of the impedance.

FIG. 5 shows that the maximum value and the minimum value of the impedance decrease when the slant angle α satisfies about −14°≤α≤about −9° or about 9°≤α≤about 14°. Therefore, when the absolute value |α| of the slant angle α satisfies about 9°≤|α|≤about 14°, the minimum value of the impedance is small. The impedance of the acoustic wave resonator has the minimum value at the resonant frequency or in the vicinity thereof. Therefore, in an acoustic wave resonator in which, as in the present preferred embodiment, about 9°≤|α|≤about 14° is satisfied, the impedance in the vicinity of the resonant frequency can be reduced. As described above, such an acoustic wave resonator is preferably used as a series arm resonator in the filter device 10. Consequently, insertion loss of the filter device 10 can be reduced. The acoustic wave resonator in which about 9°≤|α|≤about 14° is satisfied, however, may be used as a parallel arm resonator in the filter device 10.

As illustrated in FIG. 1, the filter device 10 includes a plurality of acoustic wave resonators in the present preferred embodiment. The plurality of acoustic wave resonators include a plurality of the acoustic wave devices according to a preferred embodiment of the present invention. Specifically, the plurality of acoustic wave resonators are the series arm resonator S1 and the series arm resonator S2. In this case, the slant angles α of the plurality of acoustic wave resonators according to a preferred embodiment of the present invention preferably differ from each other. Consequently, a spurious can be reduced or prevented. This will be described below.

Figure 6:
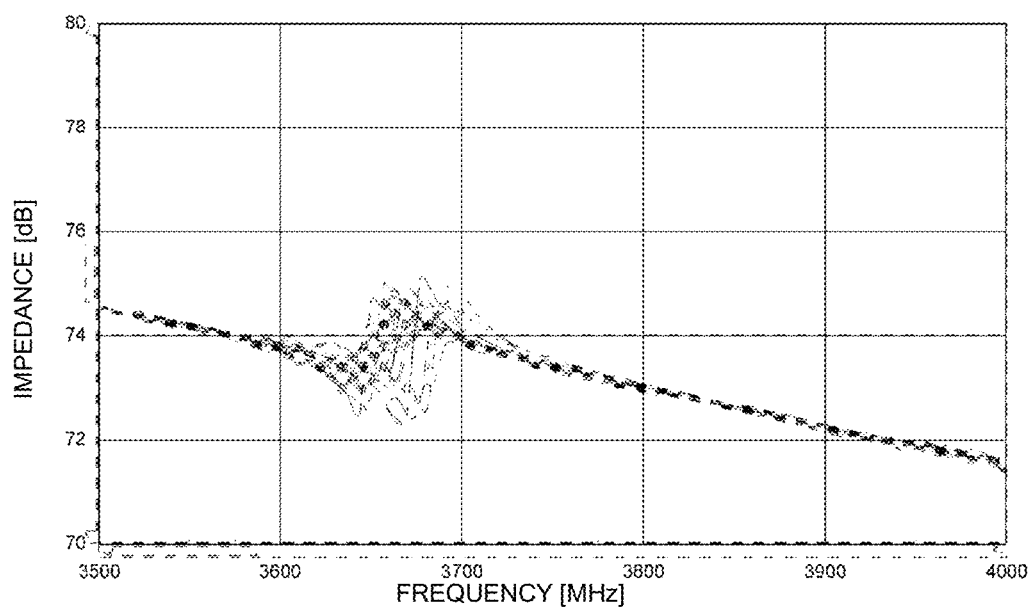
FIG. 6 is an enlarged view of the vicinity of about 3500 MHz to about 4000 MHz in FIG. 4.

FIG. 6 is an enlarged view of the vicinity of about 3500 MHz to about 4000 MHz in FIG. 4.

FIG. 6 shows that, when the slant angle α varies in the acoustic wave resonator, variations are generated in the frequency at which a spurious response is generated and in the level of the spurious. Therefore, when the slant angles α of a plurality of acoustic wave resonators each including an inclined IDT electrode differ from each other, the frequency at which a spurious response is generated and the level of the spurious response can be dispersed. Accordingly, when the slant angles α of a plurality of acoustic wave resonators differ from each other, a spurious response can be reduced or prevented in the filter device as a whole. More preferably, the filter device includes a plurality of series arm resonators in which at least two series arm resonators are acoustic wave resonators the same as or similar to that in the first preferred embodiment and in which the slant angles α of the at least two series arm resonators differ from each other. In this case, as described above, a spurious response can be reduced or prevented, and filter characteristics can be effectively improved.

Figure 7:
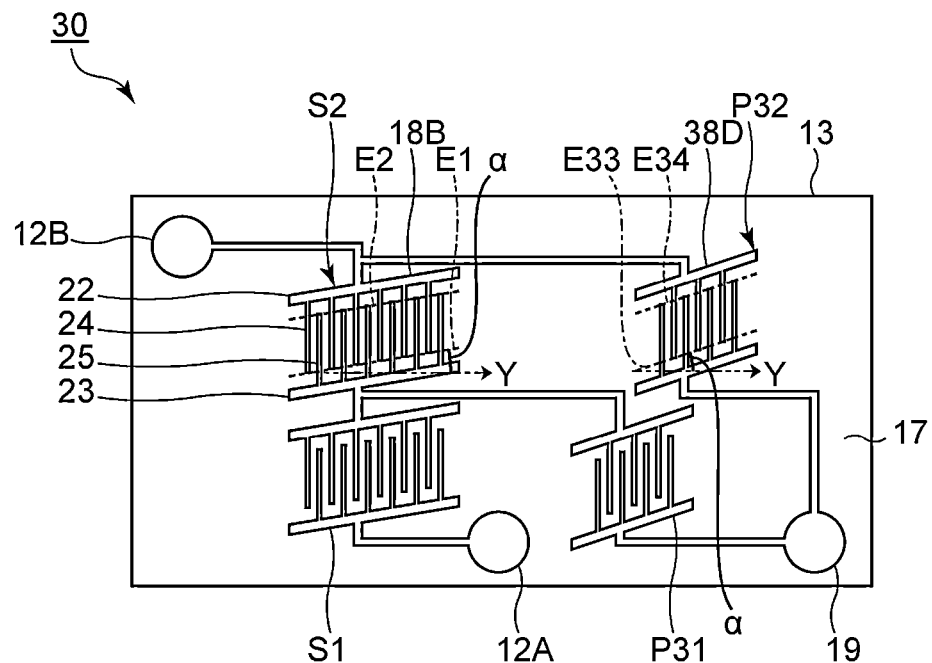
FIG. 7 is a schematic plan view of a filter device according to a second preferred embodiment of the present invention.

FIG. 7 is a schematic plan view of a filter device according to a second preferred embodiment of the present invention.

The second preferred embodiment differs from the first preferred embodiment in that a parallel arm resonator P31 and a parallel arm resonator P32 are the acoustic wave device according to a preferred embodiment of the present invention and that the absolute value |α| of the slant angle α satisfies, for example, |α|<about 9° or about 14°<|α|. Except for the above-described features, a filter device 30 in the second preferred embodiment has a configuration the same as or similar to the configuration of the filter device 10 in the first preferred embodiment. While the second preferred embodiment includes the series arm resonator S1 and the series arm resonator S2 the same as or similar to those in the first preferred embodiment, the acoustic wave resonators in the second preferred embodiment are, for example, acoustic wave resonators in each of which |α|<about 9° or about 14°<|α| is satisfied.

As illustrated in FIG. 7, an IDT electrode 38D of the parallel arm resonator P32 is an inclined IDT electrode. A first envelope E33 and a second envelope E34 of the IDT electrode 38D are parallel or substantially parallel to each other. A direction in which the first envelope E33 and the second envelope E34 extend intersects the electrode-finger facing direction and the direction of the Y-axis. The parallel arm resonator P31 similarly includes an inclined IDT electrode. The absolute value |α| of the slant angle α of each of the parallel arm resonator P31 and the parallel arm resonator P32 satisfies, for example, |α|<about 9° or about 14°<|α| and |α|≠0°.

As described above, FIG. 4 shows results that are obtained by changing the slant angle α in increments of about 2° in the range from about 0° to about 40°. In FIG. 4, results other than results when α=about 10°, α=about 12°, or α=about 14° is satisfied are results when |α|<about 9° or about 14°<|α| is satisfied. As shown in FIG. 4, when |α|<about 9° or about 14°<|α| is satisfied, steep impedance-frequency characteristics can be obtained in the vicinity of the anti-resonant frequency. Accordingly, satisfactory resonance characteristics can be obtained. An acoustic wave resonator in which, as in the second preferred embodiment, |α|<about 9° or about 14°<|α| is satisfied while |α|≠0° is satisfied is preferably used as a parallel arm resonator in the filter device 30. Consequently, the filter characteristics of the filter device 30 as a whole can be improved.

FIG. 5 shows that the maximum value and the minimum value of the impedance increase when the slant angle α satisfies α<−about 14°, about −9°<α<about 0°, about 0°<α<about 9°, or about 14°<α. Therefore, the maximum value of the impedance is large when the absolute value |α| of the slant angle α satisfies |α|<about 9° or about 14°<|α| and satisfies |α|≠0°. The impedance of the acoustic wave resonator has the maximum value at the anti-resonant frequency or in the vicinity thereof. Therefore, in acoustic wave resonator in which, as in the second preferred embodiment, |α|<about 9° or about 14°<|α| is satisfied and |α|≠0° is satisfied, the impedance in the vicinity of the anti-resonant frequency can be increased. As described above, such an acoustic wave resonator is preferably used as a parallel arm resonator in the filter device 30. Consequently, insertion loss of the filter device 10 can be reduced. The acoustic wave resonator in which |α|<about 9° or about 14°<|α| is satisfied and |α|≠0° is satisfied, however, may be used as a series arm resonator in the filter device 30.

Preferably, the filter device includes a plurality of parallel arm resonators in which at least two parallel arm resonators are acoustic wave resonators the same as or similar to that in the second preferred embodiment and in which the slant angles α of the at least two parallel arm resonators differ from each other. In this case, a spurious response can be dispersed as indicated in FIG. 6, and the spurious response can be reduced or prevented. Therefore, the filter characteristics can be effectively improved.

Figure 8:
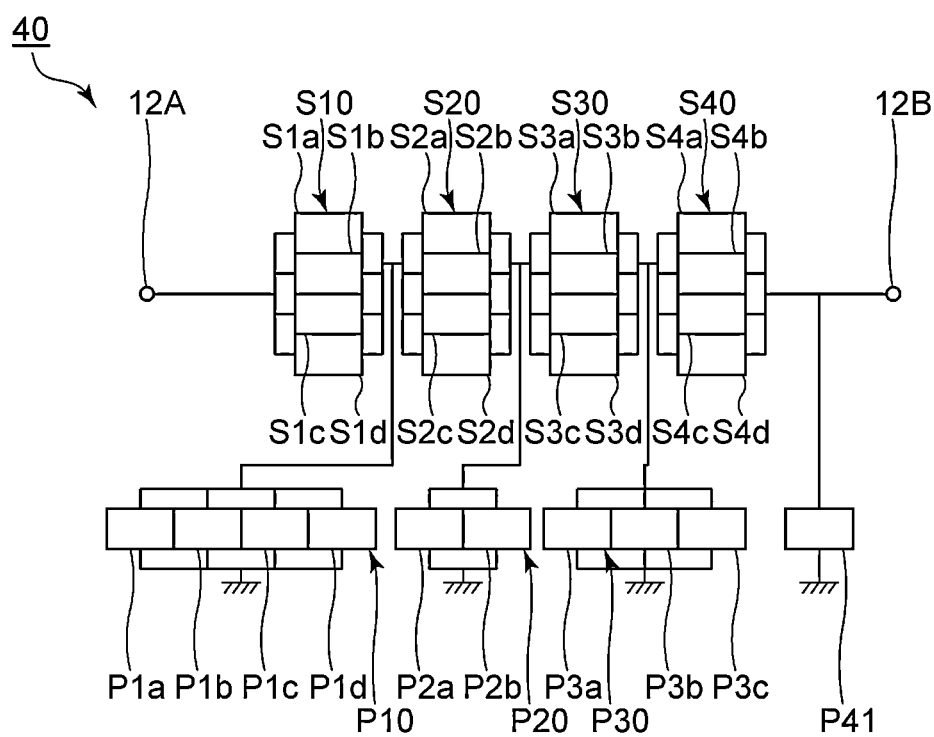
FIG. 8 is a schematic circuit diagram of a filter device according to a third preferred embodiment of the present invention.

FIG. 8 is a schematic circuit diagram of a filter device according to a third preferred embodiment of the present invention.

The present preferred embodiment differs in terms of the circuit configuration of a filter device 40 from the second preferred embodiment.

More specifically, the filter device 40 is, for example, a ladder filter. The filter device 40 includes a plurality of series arm resonators and a plurality of parallel arm resonators. The plurality of series arm resonators include a plurality of divided resonators. Similarly, the plurality of parallel arm resonators also include a plurality of divided resonators. Each of the divided resonators is a resonator in which one resonator is divided in series or divided in parallel. In the present preferred embodiment, all of the plurality of divided resonators are resonators divided in parallel. The plurality of divided resonators, however, may include resonators divided in series. All of the resonators of the filter device 40 are acoustic wave resonators.

In the filter device 40, the first signal end 12A is an input end. The second signal end 12B is an antenna end. The first signal end 12A and the second signal end 12B may each be configured as, for example, an electrode pad or a wire.

When a group of a plurality of divided resonators in which the same series arm resonators are divided is defined as a series-arm-resonator group, the filter device 40 includes a series-arm-resonator group S10, a series-arm-resonator group S20, a series-arm-resonator group S30, and a series-arm-resonator group S40. The series-arm-resonator group S10, the series-arm-resonator group S20, the series-arm-resonator group S30, and the series-arm-resonator group S40 are connected to each other in series between the first signal end 12A and the second signal end 12B. The series-arm-resonator group S10 includes, as the plurality of divided resonators, a series arm resonator S1a, a series arm resonator S1b, a series arm resonator S1c, and a series arm resonator S1d. The series-arm-resonator group S20 includes, as the plurality of divided resonators, a series arm resonator S2a, a series arm resonator S2b, a series arm resonator S2c, and a series arm resonator S2d. The series-arm-resonator group S30 includes, the plurality of divided resonators, a series arm resonator S3a, a series arm resonator S3b, a series arm resonator S3c, and a series arm resonator S3d. The series-arm-resonator group S40 includes, as the plurality of divided resonators, a series arm resonator S4a, a series arm resonator S4b, a series arm resonator S4c, and a series arm resonator S4d.

When a group of a plurality of divided resonators in which the same parallel arm resonators are divided is defined as a parallel-arm-resonator group, the filter device 40 includes a parallel-arm-resonator group P10, a parallel-arm-resonator group P20, a parallel-arm-resonator group P30, and a parallel arm resonator P41. The parallel-arm-resonator group P10 is connected between a ground potential and a connection point between the series-arm-resonator group S10 and the series-arm-resonator group S20. The parallel-arm-resonator group P20 is connected between a ground potential and a connection point between the series-arm-resonator group S20 and the series-arm-resonator group S30. The parallel-arm-resonator group P30 is connected between a ground potential and a connection point between the series-arm-resonator group S30 and the series-arm-resonator group S40. The parallel arm resonator P41 is connected between a ground potential and a second signal end 12B.

The parallel-arm-resonator group P10 includes, as the plurality of divided resonators, a parallel arm resonator P1a, a parallel arm resonator P1b, a parallel arm resonator P1c, and a parallel arm resonator P1d. The parallel-arm-resonator group P20 includes, as the plurality of divided resonators, a parallel arm resonator P2a and a parallel arm resonator P2b. The parallel-arm-resonator group P30 includes, the plurality of divided resonators, a parallel arm resonator P3a, a parallel arm resonator P3b, and a parallel arm resonator P3c.

In the present preferred embodiment, all of the divided resonators in the series-arm-resonator group S10 are acoustic wave device according to a preferred embodiment of the present invention. In addition, the absolute values of the slant angles α of all of the divided resonators in the series-arm-resonator group S10 differ from each other. It is preferable that, as described above, the slant angle α is different among the acoustic wave resonators that are divided in series or divided in parallel. Consequently, a spurious response can be effectively reduced or prevented. At least two divided resonators in the series-arm-resonator group may be an acoustic wave device according to a preferred embodiment of the present invention, and the slant angle α may be different therebetween. Alternatively, at least two divided resonators in the parallel-arm-resonator group may be an acoustic wave device according to a preferred embodiment of the present invention, and the slant angle α may be different therebetween.

It is, however, sufficient for the filter device 40 to include at least one acoustic wave device according to a preferred embodiment the present invention. Consequently, satisfactory resonance characteristics can be obtained in the resonators included in the filter device 40. When about 9°≤|α|≥about 14° is satisfied in the acoustic wave resonator, the acoustic wave resonator is preferably used as a series arm resonator. The acoustic wave resonator, however, may be used as a parallel arm resonator. Meanwhile, when |α|<about 9° or about 14°<|α| is satisfied and |α|≠0° is satisfied in the acoustic wave resonator, the acoustic wave resonator is preferably used as a parallel arm resonator. The acoustic wave resonator, however, may be used as a series arm resonator.

Figure 9:
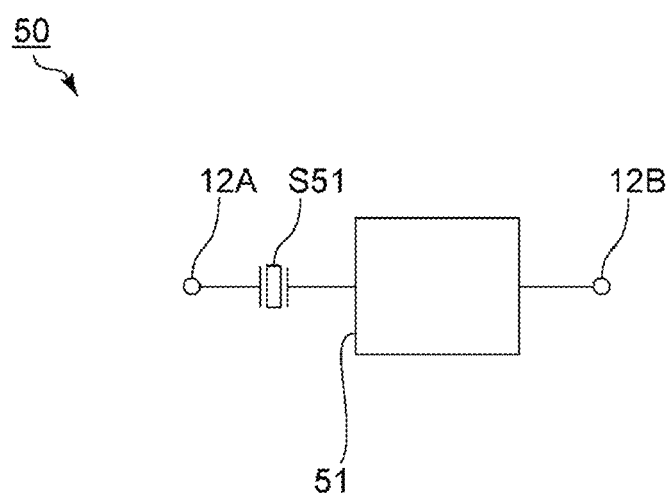
FIG. 9 is a schematic circuit diagram of a filter device according to a fourth preferred embodiment of the present invention.

FIG. 9 is a schematic circuit diagram of a filter device according to a fourth preferred embodiment of the present invention.

The present preferred embodiment differs in terms of the circuit configuration of a filter device 50 from the second preferred embodiment. More specifically, the filter device 50 includes a series arm resonator S51 and a filter portion 51. The circuit configuration of the filter portion 51 may include, for example, a longitudinally coupled resonator acoustic wave filter. The circuit configuration of the filter portion 51 is, however, not particularly limited. In the present preferred embodiment, the series arm resonator S51 is not a resonator that defines a ladder filter. The series arm resonator S51 is, for example, a trap resonator.

The series arm resonator S51 is an acoustic wave device according to a preferred embodiment of the present invention. Therefore, satisfactory resonance characteristics can be obtained in the resonator of the filter device 50. Preferably, the series arm resonator S51 is an acoustic wave device according to a preferred embodiment of the present invention in which the absolute value of the slant angle α satisfies about 9°≤|α|≤about 14°. The series arm resonator S51, however, may be an acoustic wave device according to a preferred embodiment the present invention in which the absolute value of the slant angle α satisfies |α|<about 9° or about 14°<|α| and satisfies |α|≠0°.

Figure 10:
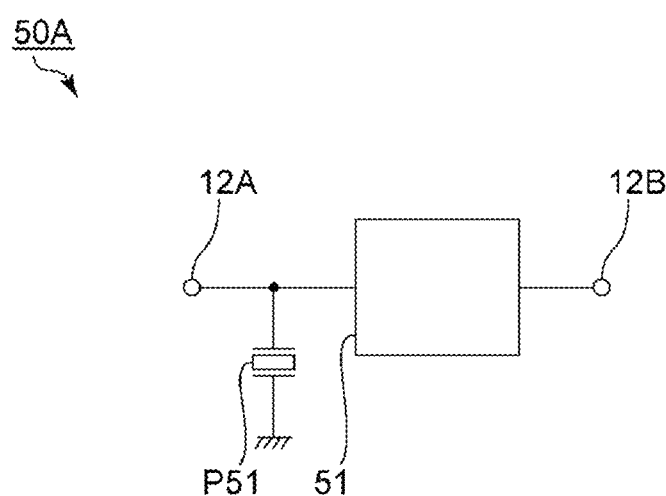
FIG. 10 is a schematic circuit diagram of a filter device according to a modification of the fourth preferred embodiment of the present invention.

In the present preferred embodiment, for example, the acoustic wave device according to a preferred embodiment of the present invention is used as a series trap. The acoustic wave device according to a preferred embodiment of the present invention, however, may be used as, for example, a parallel trap. For example, in a modification of the fourth preferred embodiment illustrated in FIG. 10, a filter device 50A includes a parallel arm resonator P51 and the filter portion 51. In the present modification, the parallel arm resonator P51 is an acoustic wave device according to a preferred embodiment of the present invention and is a trap resonator. Also in the present modification, satisfactory resonance characteristics can be obtained in the resonators of the filter device 50A. Preferably, the parallel arm resonator P51 is the acoustic wave device in the present invention in which the absolute value of the slant angle α satisfies |α|<about 9° or about 14°<|α| and satisfies |α|≠0°. The parallel arm resonator P51, however, may be an acoustic wave device according to a preferred embodiment of the present invention in which the absolute value of the slant angle α satisfies about 9°≤|α|≤about 14°.

With a regular IDT electrode used as an example, details of an acoustic wave device that uses bulk waves in a thickness shear mode will be described below. An acoustic wave device is synonymous with an acoustic wave resonator also in the following description. The piezoelectric substrates of the acoustic wave resonators in the first to fourth preferred embodiments and the modification described above are each a multilayer body including a support, an electrically insulating layer, and a piezoelectric layer illustrated in FIG. 12 and the like. The piezoelectric layer, however, may be provided directly on the support.

Figure 11A:
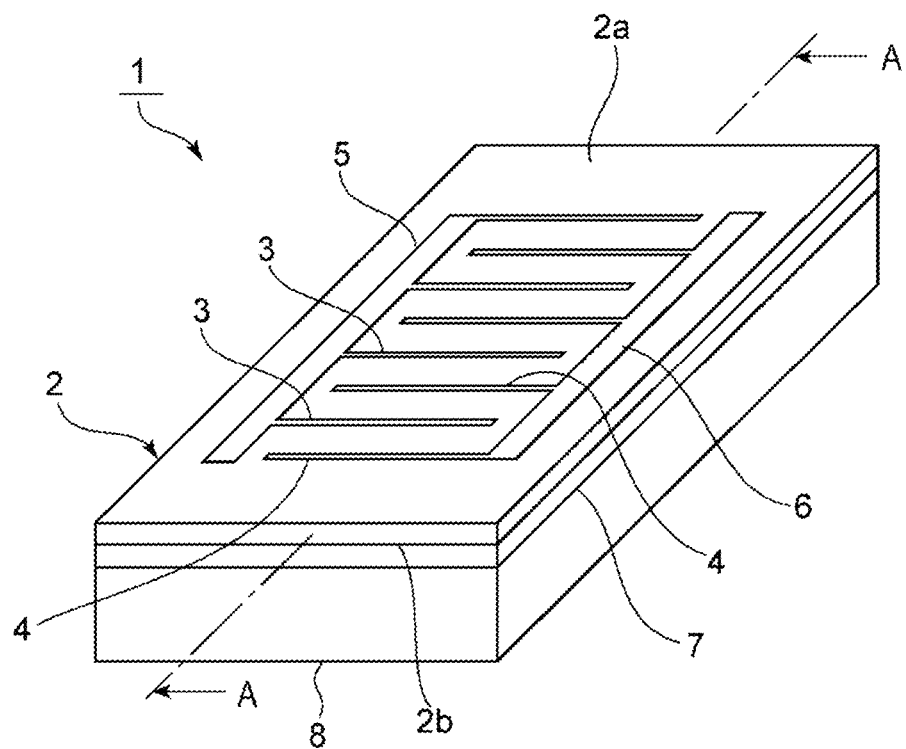
FIG. 11A is a schematic perspective view illustrating an appearance of a filter device that uses bulk waves in a thickness shear mode.
Figure 11B:
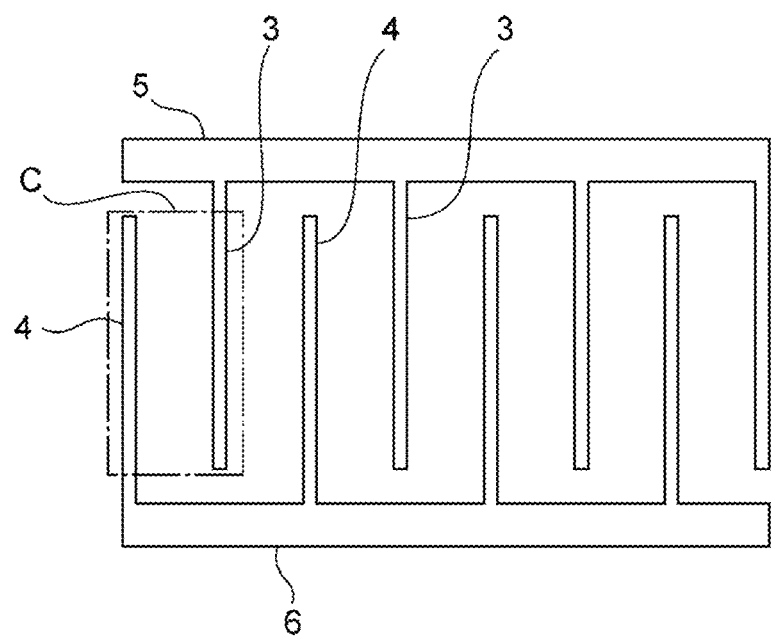
FIG. 11B is a plan view illustrating an electrode structure on a piezoelectric layer.
Figure 12:
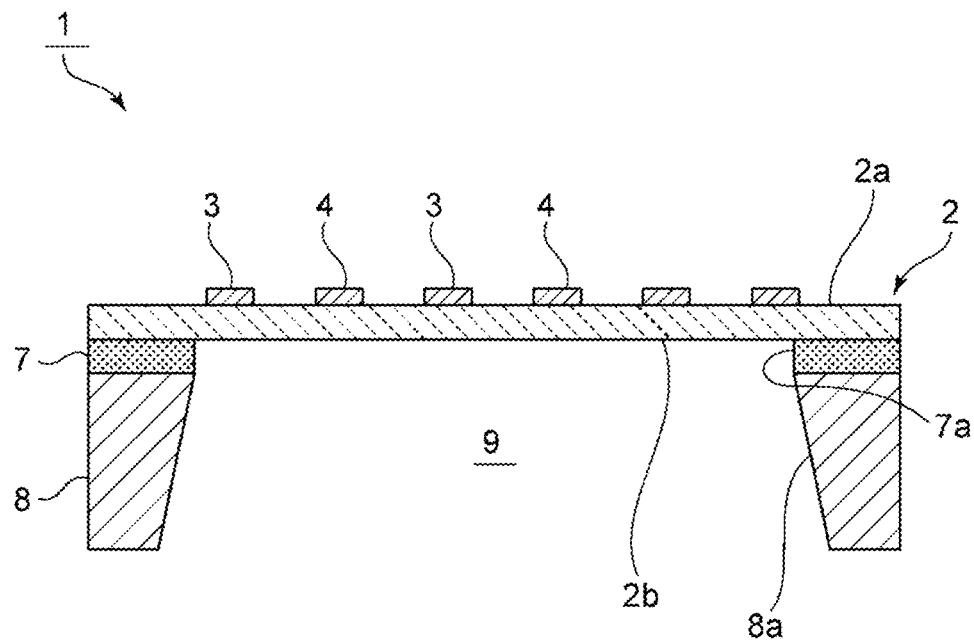
FIG. 12 is a sectional view of a portion along line A-A in FIG. 11A.

FIG. 11A is a schematic perspective view illustrating an appearance of an acoustic wave device that uses bulk waves in a thickness shear mode, FIG. 11B is a plan view illustrating an electrode structure on the piezoelectric layer, and FIG. 12 is a sectional view of a portion along line A-A in FIG. 11A.

An acoustic wave device 1 includes a piezoelectric layer 2 made of, for example, LiNbO$_3$. The cut-angle of LiNbO$_3$ is Z-cut. The thickness of the piezoelectric layer 2 is not particularly limited but is preferably, for example, more than or equal to about 40 nm and less than or equal to about 1000 nm and more preferably more than or equal to about 50 nm and less than or equal to about 1000 nm to effectively excite the thickness shear mode. The piezoelectric layer 2 includes a first main surface 2a and a second main surface 2b that face each other. An electrode 3 and an electrode 4 are provided on the first main surface 2a. Here, the electrode 3 is one example of the "first electrode", and the electrode 4 is one example of the "second electrode". In FIGS. 11A and 11B, a plurality of the electrodes 3 are connected to a first busbar 5. A plurality of the electrodes 4 are connected to a second busbar 6. The plurality of electrodes 3 and the plurality of electrodes 4 are interdigitated with each other. The electrode 3 and the electrode 4 each have a rectangular or substantially rectangular shape and include a length direction. In a direction orthogonal or substantially orthogonal to the length direction, the electrodes 3 and the electrodes 4 adjacent thereto face each other. The plurality of electrodes 3 and 4, the first busbar 5, and the second busbar 6 define an IDT (Interdigital Transducer) electrode. The length directions of the electrodes 3 and 4 and a direction orthogonal or substantially orthogonal to the length directions of the electrodes 3 and 4 are each a direction intersecting the thickness direction of the piezoelectric layer 2. Therefore, it can be said that the electrodes 3 and the electrodes 4 adjacent thereto face each other in the direction intersecting the thickness direction of the piezoelectric layer 2. The length directions of the electrodes 3 and 4 may be replaced with a direction orthogonal or substantially orthogonal to the length directions of the electrodes 3 and 4 illustrated in FIGS. 11A and 11B. In other words, in FIGS. 11A and 11B, the electrodes 3 and 4 may extend in the direction in which the first busbar 5 and the second busbar 6 extend. In this case, the first busbar 5 and the second busbar 6 extend in the direction in which the electrodes 3 and 4 extend in FIGS. 11A and 11B. Then, a plurality of pairs of a structure in each of which the electrode 3 connected to one potential and the electrode 4 connected to the other potential are adjacent to each other are provided in the direction orthogonal or substantially orthogonal to the length directions of the aforementioned electrodes 3 and 4. Here, the electrode 3 and the electrode 4 that are adjacent to each other do not denote that the electrode 3 and the electrode 4 are disposed in direct contact with each other, but denote that the electrode 3 and the electrode 4 are disposed with a gap interposed therebetween. When the electrode 3 and the electrode 4 are adjacent to each other, electrodes, including the other electrodes 3 and 4, connected to a hot electrode and a ground electrode are not disposed between the electrode 3 and the electrode 4. The number of the pairs is not necessarily an integer number and may be 1.5 or 2.5. A center-to-center distance, that is, a pitch between the electrode 3 and the electrode 4 is preferably, for example, within the range from about 1 μm to about 10 μm. The width of each of the electrodes 3 and 4, that is, the dimension thereof in the facing direction of the electrodes 3 and 4 is preferably, for example, within the range from about 50 nm to about 1000 nm and more preferably within the range from about 150 nm to about 1000 nm. The center-to-center distance between the electrodes 3 and 4 is a distance that connects the center of the dimension (width dimension) of the electrode 3 in a direction orthogonal or substantially orthogonal to the length direction of the electrode 3 and the center of a dimension (width dimension) of the electrode 4 in a direction orthogonal or substantially orthogonal to the length direction of the electrode 4 to each other.

In the acoustic wave device 1, for example, a Z-cut piezoelectric layer is used, and thus, the directions orthogonal or substantially orthogonal to the length directions of the electrode 3 or 4 are directions orthogonal or substantially orthogonal to a polarization direction of the piezoelectric layer 2. The above is not applicable to a case where a piezoelectric body of the other cut-angle is used as the piezoelectric layer 2. Here, "orthogonal" is not limited only to exactly orthogonal and may be substantially orthogonal (an angle formed by the direction orthogonal to the length direction of the electrode 3 or 4 and the polarization direction may be, for example, in the range of about 90°±10°).

A support 8 is laminated on the side of the second main surface 2b of the piezoelectric layer 2 with an electrically insulating layer 7 interposed therebetween. The electrically insulating layer 7 and the support 8 each have a frame shape and, as illustrated in FIG. 12, include an opening portions 7a and 8a, respectively. Consequently, a cavity portion 9 is provided. The cavity portion 9 is provided so that vibration of the excitation regions C of the piezoelectric layer 2 is not obstructed. Accordingly, the support 8 is laminated on the second main surface 2b with the electrically insulating layer 7 interposed therebetween at a position not overlapping a portion at which at least a pair of the electrodes 3 and 4 is provided. The electrically insulating layer 7 is not necessarily provided. Accordingly, the support 8 is laminated on the second main surface 2b of the piezoelectric layer 2 directly or indirectly.

The electrically insulating layer 7 is made of, for example, silicon oxide. However, an appropriate electrically insulative material, other than silicon oxide, such as, for example, silicon nitride or alumina is usable. The support 8 is made of, for example, Si. The orientation of Si at a surface on the piezoelectric layer 2 side may be (100) or (110) and may be (111). Preferably, the Si of the support 8 is highly resistive with a resistivity of, for example, more than or equal to about 4 kΩ. The support 8, however, also may be made of an appropriate electrically insulating material or an appropriate semiconductor material.

Examples of materials usable as the material of the support 8 are a piezoelectric body, such as aluminum oxide, lithium tantalate, lithium niobate, or quartz, various types of ceramic materials, such as alumina, magnesia, sapphire, silicon nitride, aluminum nitride, silicon carbide, zirconia, cordierite, mullite, steatite, or forsterite, a dielectric, such as diamond or glass, a semiconductor, such as gallium nitride, and the like.

The plurality of electrodes 3 and 4 and the first and second busbars 5 and 6 are each made of an appropriate metal or an appropriate alloy, such as, for example, Al or an AlCu alloy. In the present preferred embodiment, the electrodes 3 and 4, and the first and second busbars 5 and 6 each have a structure in which, for example, an Al film is laminated on a Ti film. A close-contact layer other than the Ti film may be used.

An alternating-current voltage is applied between the plurality of electrodes 3 and the plurality of electrodes 4 to perform driving the acoustic wave device 1. More specifically, the alternating-current voltage is applied between the first busbar 5 and the second busbar 6. Consequently, it is possible to obtain resonance characteristics by using bulk waves in a thickness shear mode excited in the piezoelectric layer 2. In addition, in the acoustic wave device 1, when the thickness of the piezoelectric layer 2 is d and the center-to-center distance of, among the plurality of electrodes 3 and 4, electrodes 3 and 4 adjacent to each other is p, d/p is less than or equal to about 0.5, for example. Therefore, bulk waves in the thickness shear mode are effectively excited, and satisfactory resonance characteristics can be obtained. More preferably, for example, d/p is less than or equal to about 0.24. In this case, more satisfactory resonance characteristics can be obtained.

In the acoustic wave device 1, due to having the above-described configuration, the Q-value is unlikely to decrease, even when the number of pairs of the electrodes 3 and 4 is reduced to downsize the acoustic wave device 1. This is because, propagation loss is small even when the number of the electrode fingers of reflectors on both sides is reduced. Reducing the number of the electrode fingers is enabled by using bulk waves in the thickness shear mode. A difference between lamb waves used in an acoustic wave device and bulk waves in the thickness shear mode will be described with reference to FIGS. 13A and 13B.

Figure 13A:
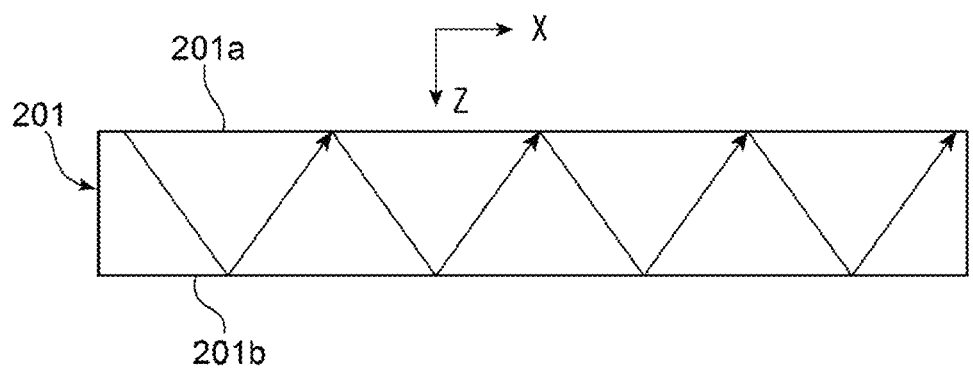
FIG. 13A is a schematic elevational cross-sectional view for describing lamb waves propagating through a piezoelectric film of an acoustic wave device.

FIG. 13A is a schematic elevational cross-sectional view for describing lamb waves that propagate in a piezoelectric film of an acoustic wave device such as that described in Japanese Unexamined Patent Application Publication No. 2012-257019. Here, waves propagate as indicated by arrows in a piezoelectric film 201. In the piezoelectric film 201, a first main surface 201a and a second main surface 201b face each other, and a thickness direction connecting the first main surface 201a and the second main surface 201b to each other is the Z-direction. The X-direction is a direction in which electrode fingers of an IDT electrode are disposed side by side. As illustrated in FIG. 13A, the waves of lamb waves propagate in the X-direction in the manner illustrated in FIG. 13A. Since the waves are plate waves, the waves propagate in the X-direction although the piezoelectric film 201 vibrates as a whole. Therefore, reflectors are disposed on both sides to obtain resonance characteristics. Therefore, propagation loss of the waves is generated, and the Q-value decreases when downsizing is performed, in other words, when the number of the electrode fingers is reduced.

Figure 13B:
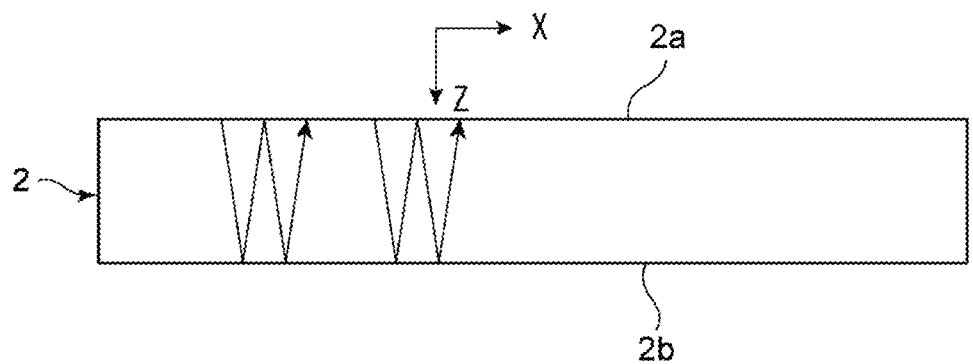
FIG. 13B is a schematic elevational cross-sectional view for describing bulk waves in a thickness shear mode propagating through a piezoelectric film in a filter device.

In contrast, as illustrated in FIG. 13B, vibration displacement in the acoustic wave device 1 is in the thickness shear direction, and thus, waves propagate substantially in a direction connecting the first main surface 2a and the second main surface 2b of the piezoelectric layer 2 to each other, that is, in the Z-direction and resonates. That is, the X-direction component of the waves is significantly smaller than the Z-direction component of the waves. Since resonance characteristics are obtained by the propagation of the waves in this Z-direction, propagation loss is unlikely to occur even when the number of the electrode fingers of reflectors is reduced. Further, even when the number of pairs of electrode pairs of the electrodes 3 and 4 is reduced for downsizing, the Q-value is unlikely to decrease.

Figure 14:
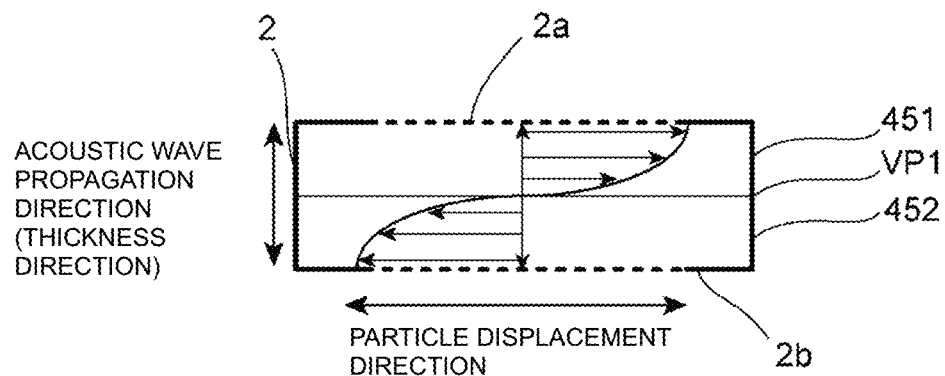
FIG. 14 illustrates an amplitude direction of bulk waves in a thickness shear mode.

As illustrated in FIG. 14, the amplitude direction of bulk waves in the thickness shear mode is opposite between a first region 451 included in the excitation regions C of the piezoelectric layer 2 and a second region 452 included in the excitation regions C. FIG. 14 schematically illustrates bulk waves when a voltage that causes the electrode 4 to have a higher potential than the electrode 3 is applied between the electrode 3 and the electrode 4. The first region 451 is a region included in the excitation regions C and present between the first main surface 2a and an imaginary plane VP1 orthogonal or substantially orthogonal to the thickness direction of the piezoelectric layer 2 and dividing the piezoelectric layer 2 into two. The second region 452 is a region included in the excitation regions C and present between the second main surface 2b and the imaginary plane VP1.

Although, as described above, at least one pair of electrodes of the electrode 3 and the electrode 4 is disposed in the acoustic wave device 1, the pair of electrodes is not for causing waves to propagate in the X-direction. Therefore, a plurality of pairs of the electrode pairs of the electrode 3 and the electrode 4 is not required. In other words, it is sufficient that at least one pair of the electrodes is provided.

For example, the electrode 3 is an electrode that is connected to a hot potential, and the electrode 4 is an electrode that is connected to a ground potential. The electrode 3, however, may be connected to a ground potential while the electrode 4 is connected to a hot potential. In the present preferred embodiment, at least one pair of the electrodes are, as described above, the electrode connected to the hot potential or the electrode connected to a ground potential, and no floating electrode is provided.

Figure 15:
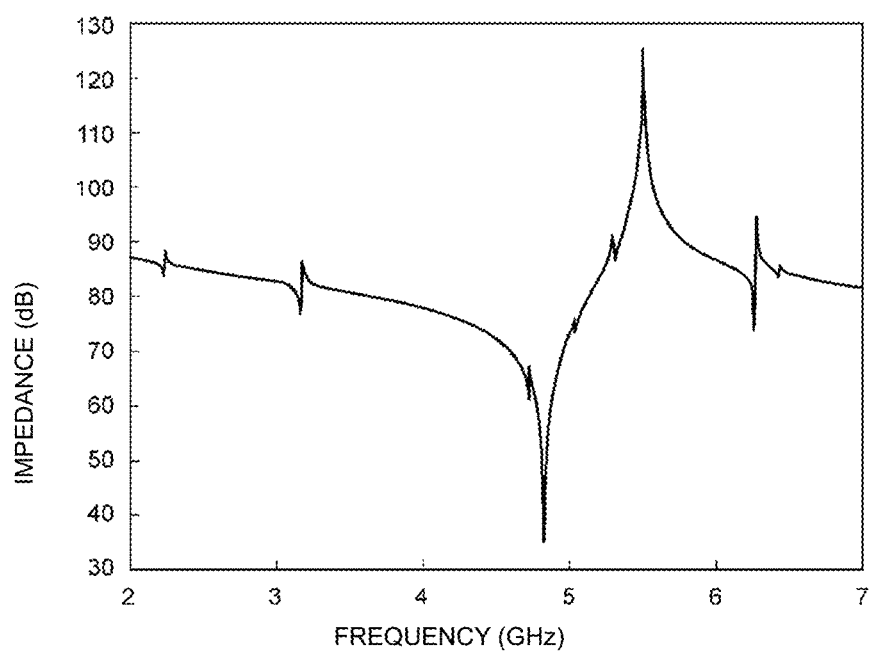
FIG. 15 is a graph showing resonance characteristics of a filter device that uses bulk waves in a thickness shear mode.

FIG. 15 is a graph showing resonance characteristics of the acoustic wave device illustrated in FIG. 12. Design parameters of the acoustic wave device 1 with which the resonance characteristics are obtained are as follows.

Piezoelectric layer 2: LiNbO$_3$ having Euler angles (about 0°, about 0°, about 90°), thickness=about 400 nm The length of a region in which the electrode 3 and the electrode 4 overlap each other when viewed in a direction orthogonal to the length directions of the electrode 3 and the electrode 4, in other words, the length of each of the excitation regions C=about 40 μm, the number of pairs of the electrodes constituted by the electrodes 3 and 4=21 pairs, the center-to-center distance between the electrodes=about 3 μm, the width of each of the electrodes 3 and 4=about 500 nm, and d/p=about 0.133

Electrically insulating layer 7: a silicon oxide film having a thickness of about 1 μm Support 8: Si The length of each of the excitation regions C is a dimension of each of the excitation regions C in the length directions of the electrodes 3 and 4.

In the present preferred embodiment, the distance between electrodes of an electrode pair including the electrodes 3 and 4 is the same or substantially the same among a plurality of the pairs. In other words, the electrodes 3 and the electrodes 4 are disposed at an equal or substantially equal pitch.

FIG. 15 clearly shows that satisfactory resonance characteristics in which the fractional band is about 12.5% can be obtained despite the absence of reflectors.

Meanwhile, as described above, d/p is less than or equal to about 0.5, where d is the thickness of the piezoelectric layer 2 and p is the center-to-center distance of the electrodes including the electrode 3 and the electrode 4, and d/p is more preferably less than or equal to about 0.24 in the present preferred embodiment. This will be described with reference to FIG. 16.

Figure 16:
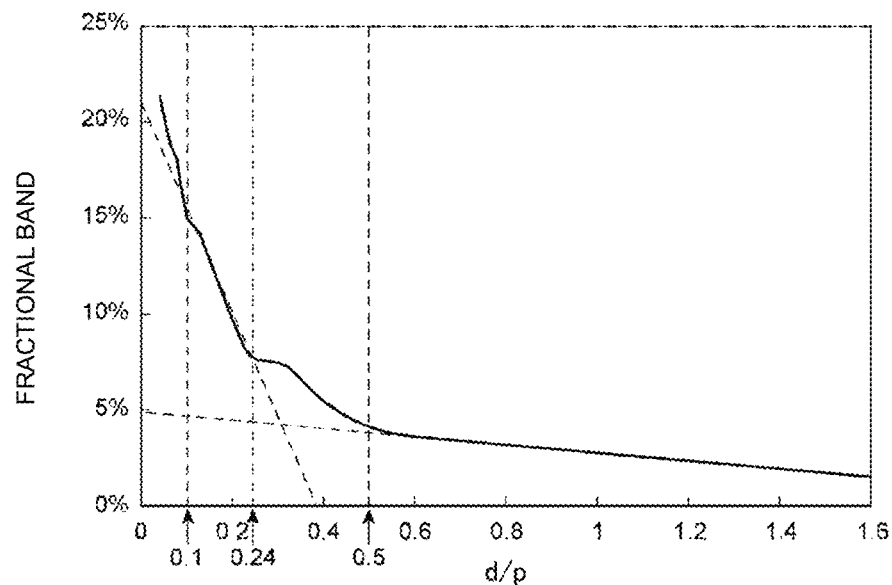
FIG. 16 is a graph showing a relationship between a fractional band as a resonator and d/p, where p is a center-to-center distance of electrodes adjacent to each other and d is a thickness of a piezoelectric layer.

A plurality of acoustic wave devices were obtained in the same or substantially the same manner, except that d/p was varied, as the acoustic wave device with which the resonance characteristics indicated in FIG. 15 were obtained. FIG. 16 is a graph showing a relationship between the d/p and the fractional band as a resonator of an acoustic wave device.

FIG. 16 clearly shows that the fractional band is less than about 5% when d/p>about 0.5 is satisfied, even when d/p is adjusted. In contrast, when d/p≤about 0.5 is satisfied, it is possible to cause the fractional band to be more than or equal to about 5% by changing d/p within the range. In other words, it is possible to configure a resonator that has a high coupling coefficient. When d/p is less than or equal to about 0.24, the fractional band can be increased to be more than or equal to about 7%. In addition, by adjusting d/p within this range, it is possible to obtain a resonator having a wider fractional band and possible to achieve a resonator having a higher coupling coefficient. Accordingly, it was discovered and confirmed that, by setting d/p to be less than or equal to about 0.5, it is possible to configure a resonator that uses bulk waves in the thickness shear mode and that has a high coupling coefficient.

Figure 17:
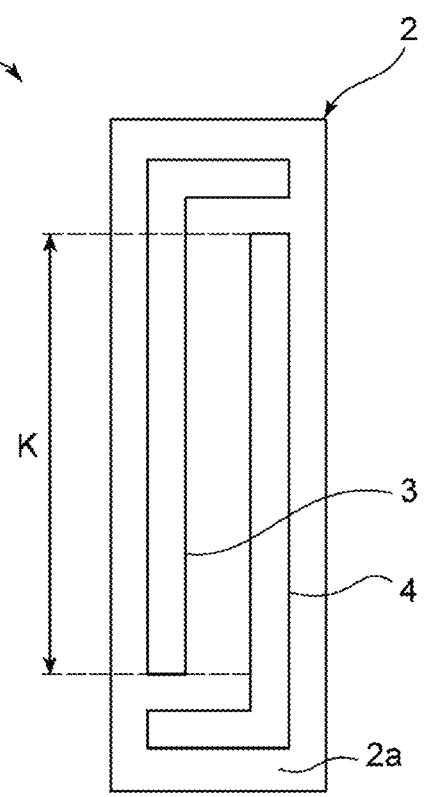
FIG. 17 is a plan view of an acoustic wave device that uses bulk waves in a thickness shear mode.

FIG. 17 is a plan view of an acoustic wave device that uses bulk waves in a thickness shear mode. In an acoustic wave device 80, a pair of electrodes including the electrode 3 and the electrode 4 is provided on the first main surface 2a of the piezoelectric layer 2. In FIG. 17, K is an intersection width. As described above, the number of pairs of electrodes may be one in an acoustic wave device according to a preferred embodiment of the present invention. It is also possible in this case to effectively excite bulk waves in a thickness shear mode when the aforementioned d/p is less than or equal to about 0.5.

Figure 18:
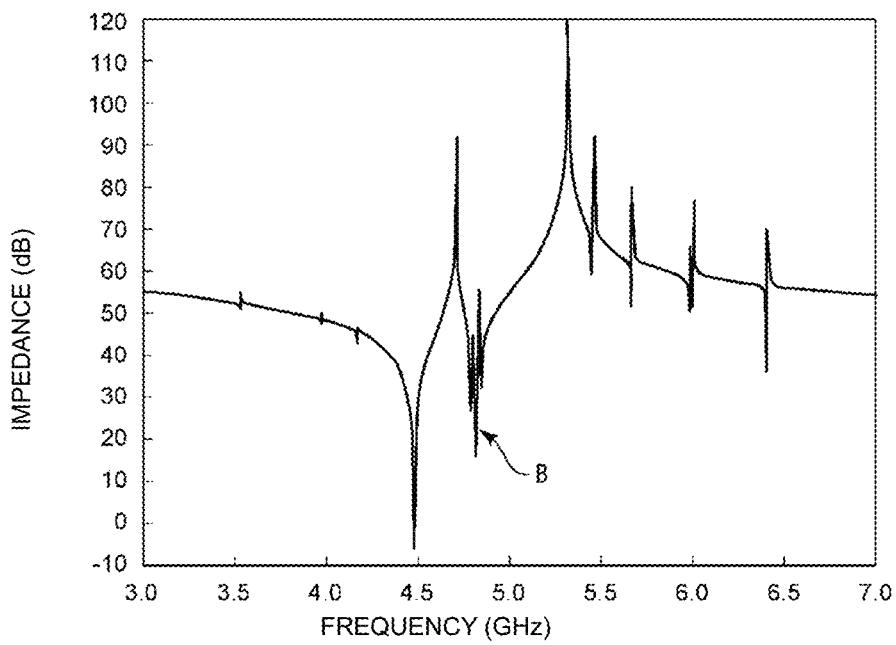
FIG. 18 is a graph showing resonance characteristics of an acoustic wave device in a reference example in which a spurious response appears.

Preferably, in the acoustic wave device 1, a metallization ratio MR of, among a plurality of the electrodes 3 and 4, electrodes 3 and 4 adjacent to each other with respect to the excitation region C, which is a region in which the electrodes 3 and 4 overlap each other when viewed in a direction in which the electrodes 3 and 4 adjacent to each other face each other, satisfies MR≤about 1.75(d/p)+0.075. In such a case, it is possible to effectively cause a spurious response to be small. This will be described with reference to FIG. 18 and FIG. 19. FIG. 18 is a reference graph showing one example of resonance characteristics of the acoustic wave device 1. A spurious response indicated by the arrow B appeared between the resonant frequency and the anti-resonant frequency. Note that d/p=about 0.08 and LiNbO$_3$ has Euler angles (about 0°, about 0°, about 90°). In addition, note that the metallization ratio MR=about 0.35.

The metallization ratio MR will be described with reference to FIG. 11B. When one pair of the electrodes 3 and 4 is focused in the electrode structure in FIG. 11B, it is assumed that only this one pair of the electrodes 3 and 4 is provided. In this case, a portion surrounded by the dashed dotted line C is an excitation region. This excitation region C is a region in the electrode 3 overlapping the electrode 4, a region in the electrode 4 overlapping the electrode 3, and, in a region between the electrode 3 and the electrode 4, a region in which the electrode 3 and the electrode 4 overlap each other when the electrode 3 and the electrode 4 are viewed in a direction orthogonal to the length directions of the electrodes 3 and 4, that is, in the facing direction. The ratio of the areas of the electrodes 3 and 4 in the excitation region C to the area of this excitation region C is the metallization ratio MR. In other words, the metallization ratio MR is a ratio of the area of a metallization portion to the area of the excitation region C.

When a plurality of pairs of electrodes are provided, a ratio of the metallization portion included in all of the excitation regions to the total of the areas of the excitation regions can be considered as MR.

Figure 19:
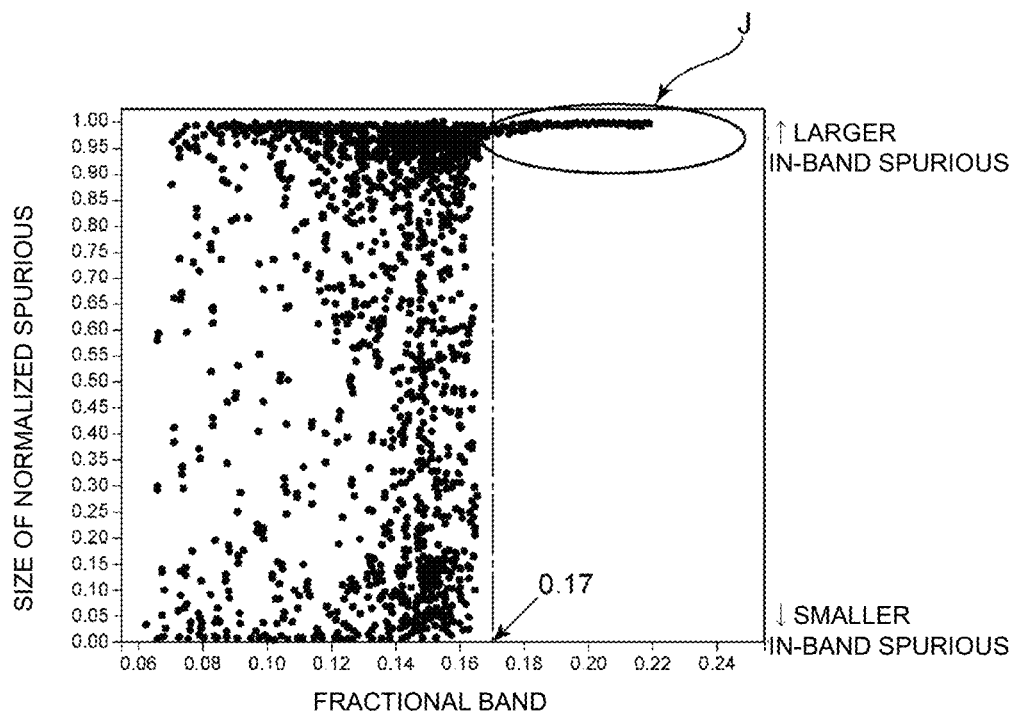
FIG. 19 is a graph showing a relationship between a fractional band and a phase rotation amount of an impedance of a spurious response normalized by 180 degrees as the size of the spurious response.

FIG. 19 is a graph showing a relationship between a fractional band when a large number of acoustic wave resonators are configured according to the present preferred embodiment and the phase rotation amount of an impedance of a spurious response normalized by 180 degrees as the size of the spurious response. The fractional band was adjusted by variously changing the film thickness of the piezoelectric layer and the dimensions of the electrodes. FIG. 18 shows results when a piezoelectric layer constituted by Z-cut LiNbO$_3$ was used. A tendency is, however, the same or substantially the same when a piezoelectric layer of the other cut-angle is used.

The spurious response is 1.0, which is large, in a region surrounded by the ellipse J in FIG. 19. FIG. 19 clearly shows that when the fractional band exceeds about 0.17, in other words, exceeds about 17%, a large spurious response whose spurious level is more than or equal to about 1 appears in the pass band even when parameters that define the fractional band are changed. In other words, as with the resonance characteristics shown in FIG. 18, a large spurious response indicated by the arrow B appears in the band. Therefore, the fractional band is preferably less than or equal to about 17%.

In this case, it is possible to cause the spurious response to be small by adjusting the film thickness of the piezoelectric layer 2, the dimensions of the electrodes 3 and 4, and the like.

Figure 20:
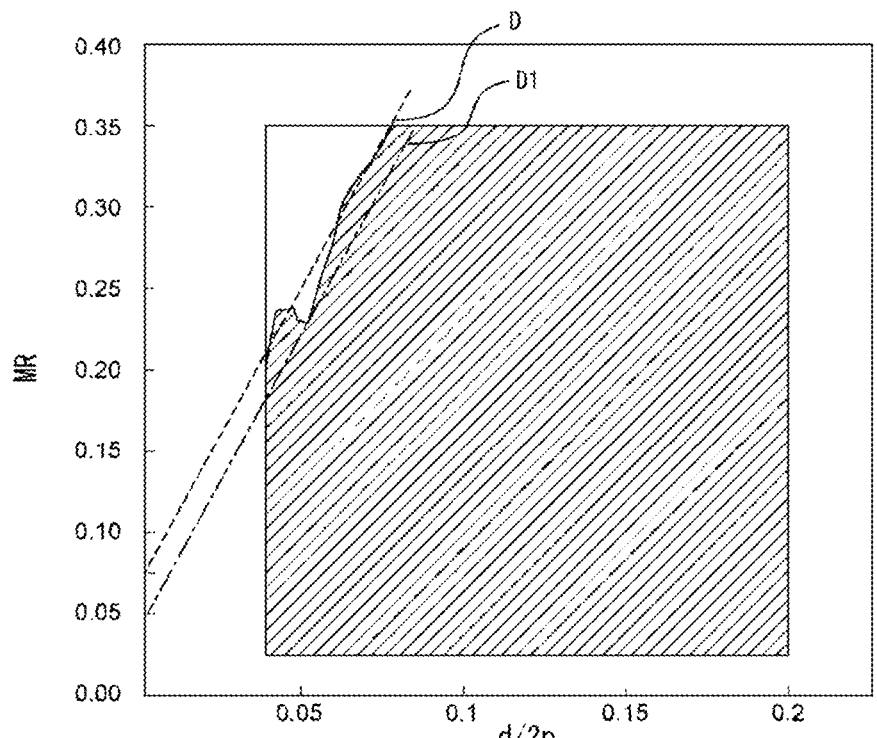
FIG. 20 is a graph showing a relationship between d/2p and a metallization ratio MR.

FIG. 20 is a graph showing a relationship among d/2p, the metallization ratio MR, and the fractional band. Various acoustic wave devices in which d/2p and MR are different from those in the above-described acoustic wave device were configured, and the fractional band was measured. In FIG. 20, the hatched portion on the right side of the dashed line D is a region in which the fractional band is less than or equal to about 17%. The boundary between the hatched region and a non-hatched region is expressed by MR=about 3.5(d/2p)+0.075. In other words, MR=about 1.75(d/p)+0.075. Thus, preferably, for example, MR≤about 1.75(d/p)+0.075. In such a case, the fractional band is likely to be less than or equal to about 17%. A region on the right side of MR=about 3.5(d/2p)+0.05 indicated by the dashed dotted line D1 in FIG. 20 is more preferable. In other words, when MR≤about 1.75(d/p)+0.05 is satisfied, it is possible to reliably cause the fractional band to be less than or equal to about 17%.

Figure 21:
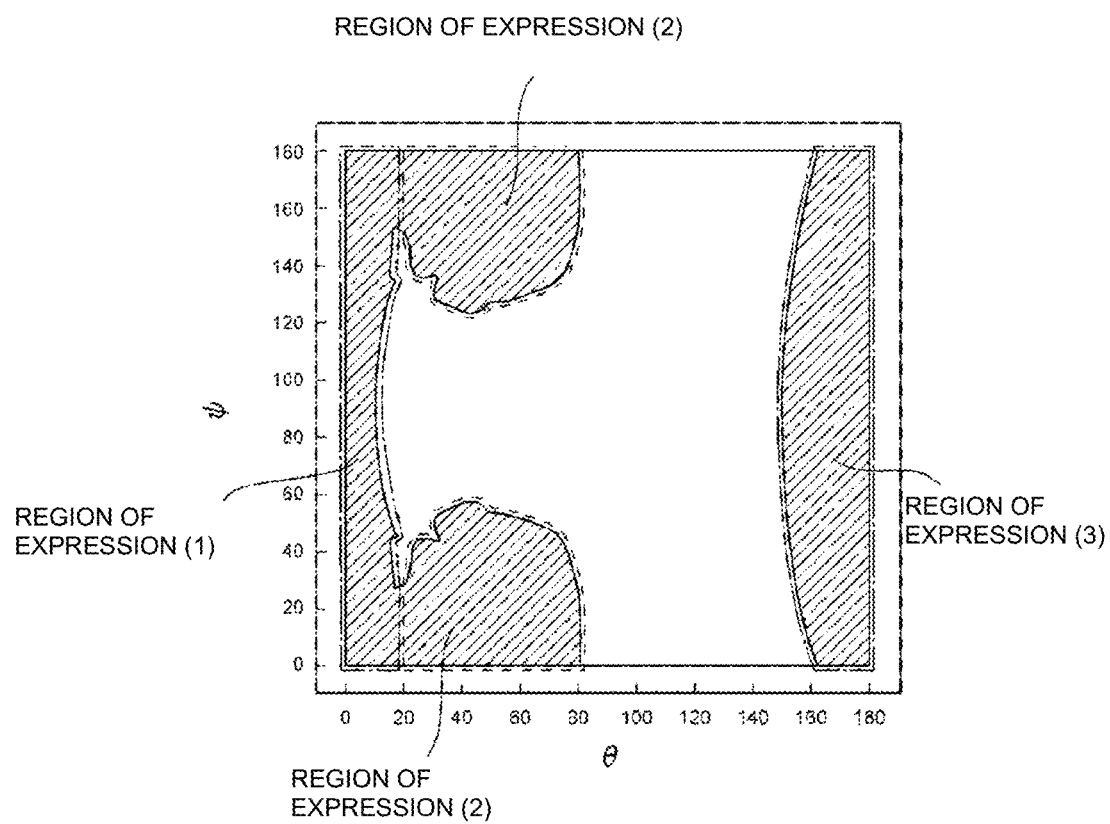
FIG. 21 is a graph showing a map of a fractional band with respect to Euler angles (0°, θ, Ψ) of LiNbO$_3$ when d/p is approximated to zero as closely as possible.

FIG. 21 is a graph showing a map of the fractional band with respect to the Euler angles (0°, θ, Ψ) of LiNbO$_3$ when d/p is approximated to zero as closely as possible. The hatched portion in FIG. 21 is a region in which a fractional band of at least more than or equal to about 5% is obtained. When the range of the region is approximated, the range is expressed by following Expression (1), Expression (2), and Expression (3).

$$(0°\pm10°, 0° \text{ to } 20°, \text{optional } \Psi) \quad (1)$$

$$(0°\pm10°, 20° \text{ to } 80°, 0° \text{ to } 60°(1-(\theta-50)2/900)1/2) \text{ or } (0°\pm10°, 20° \text{ to } 80°, [180°-60°(1-(\theta-50)2/900) 1/2] \text{ to } 180°) \quad (2)$$

$$(0°\pm10°, [180°-30°(1-(\Psi-90)2/8100)1/2] \text{ to } 180°, \text{optional } \Psi) \quad (3)$$

Accordingly, in the Euler angle range expressed by Expression (1), Expression (2), or Expression (3) above, the fractional band can be sufficiently widened, which is preferable.

Figure 22:
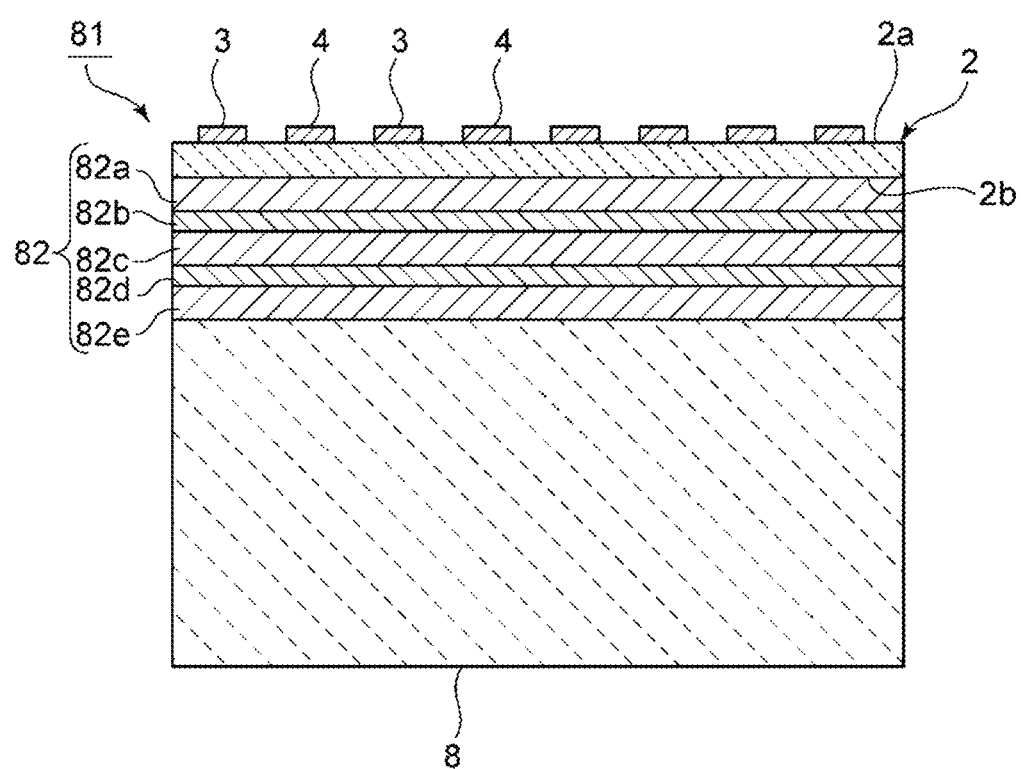
FIG. 22 is an elevational cross-sectional view of an acoustic wave device that includes an acoustic multilayer film according to a preferred embodiment of the present invention.

FIG. 22 is an elevational cross-sectional view of an acoustic wave device that includes an acoustic multilayer film according to a preferred embodiment of the present invention. In an acoustic wave device 81, an acoustic multilayer film 82 is laminated on the second main surface 2b of the piezoelectric layer 2. The acoustic multilayer film 82 has a multilayer structure including low-acoustic-impedance layers 82a, 82c, and 82e each having a relatively low acoustic impedance and high-acoustic-impedance layers 82b and 82d each having a relatively high acoustic impedance. When using the acoustic multilayer film 82, it is possible without using the cavity portion 9 in the acoustic wave device 1 to confine bulk waves in the thickness shear mode inside the piezoelectric layer 2. It is also possible in the acoustic wave device 81 to obtain resonance characteristics based on bulk waves in the thickness shear mode by setting the above-described d/p to be, for example, less than or equal to about 0.5. In the acoustic multilayer film 82, the number of the low-acoustic-impedance layers 82a, 82c, and 82e and the high-acoustic-impedance layers 82b and 82d is not particularly limited. It is sufficient that at least one layer of the high-acoustic-impedance layer 82b or 82d is disposed on the side farther than the low-acoustic-impedance layers 82a, 82c, and 82e from the piezoelectric layer 2.

As long as the relationship of the above-described acoustic impedance is satisfied, the low-acoustic-impedance layers 82a, 82c, and 82e and the high-acoustic-impedance layers 82b and 82d can each be made of an appropriate material.

An example of the material of the low-acoustic-impedance layers 82a, 82c, and 82e is silicon oxide, silicon nitride, or the like. An example of the material of the high-acoustic-impedance layers 82b and 82d is alumina, silicon nitride, metal, or the like.

As described above, each of the piezoelectric substrates in the preferred embodiments and the modification described above is a multilayer body illustrated in FIG. 12. In the above-described piezoelectric substrate, the support 8 may include the cavity portion 9. Further, at least a portion of the IDT electrode and the cavity portion 9 may overlap each other in plan view.

For example, as illustrated in FIG. 22, the acoustic multilayer film 82 as an acoustic reflection film may be provided between the support 8 and the piezoelectric layer 2 in the piezoelectric substrate in each of the above-described preferred embodiments and modification. In the acoustic wave resonators in the above-described preferred embodiments and modification, d/p is preferably, for example, less than or equal to about 0.24. Consequently, more satisfactory resonance characteristics can be obtained. Further, it is preferable that, as described above, MR≤about 1.75(d/p)+0.075 is satisfied in the acoustic wave resonators in the above-described preferred embodiments and modification. In this case, a spurious response is more reliably reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device to be connected between a first signal end and a second signal end of a filter device, the acoustic wave device comprising:

a support;

a piezoelectric layer on the support, the piezoelectric layer including an X-axis, a Y-axis, and a Z-axis that are crystal axes and being made of Z-cut lithium niobate; and an IDT electrode on the piezoelectric layer; wherein the IDT electrode includes a first busbar and a second busbar that face each other, a plurality of first electrode fingers each including one end connected to the first busbar, and a plurality of second electrode fingers each including one end connected to the second busbar and being interdigitated with the plurality of first electrode fingers;

d/p is less than or equal to about 0.5, where d is a thickness of the piezoelectric layer and p is a center-to-center distance of the first electrode fingers and the second electrode fingers adjacent to each other;

a direction in which an envelope extends and a direction of the Y-axis intersect each other, the envelope being an imaginary line connecting tips of the plurality of first electrode fingers; and about 9°≤|α|≤about 14° is satisfied, where |α| is an absolute value of a slant angle α, the slant angle α being an angle of a corner that is defined by the direction in which the envelope extends and the direction of the Y-axis and being an angle other than 0°.

2. The acoustic wave device according to claim 1, wherein
the support includes a cavity portion that is open on a side of the piezoelectric layer; and
at least a portion of the IDT electrode overlaps the cavity portion in plan view.

3. The acoustic wave device according to claim 1, further comprising:
an acoustic reflection film between the support and the piezoelectric layer; wherein
the acoustic reflection film includes at least one low-acoustic-impedance layer having a relatively low acoustic impedance and at least one high-acoustic-impedance layer having a relatively high acoustic impedance, the low-acoustic-impedance layer and the high-acoustic-impedance layer being alternately laminated on each other.

4. The acoustic wave device according to claim 1, wherein d/p is less than or equal to about 0.24.

5. The acoustic wave device according to claim 1, wherein MR≤about 1.75(d/p)+0.075 is satisfied, where MR is a metallization ratio of the plurality of electrode fingers with respect to an excitation region, the excitation region being a region in which the first electrode fingers and the second electrode fingers adjacent to each other overlap each other when viewed in a direction in which the first electrode fingers and the second electrode fingers face each other.

6. The acoustic wave device according to claim 1, wherein Euler angles (ϕ, θ, Ψ) of lithium niobate of the piezoelectric layer are in a range of following Expression (1), Expression (2), or Expression (3):

$$(0°\pm10°, 0° \text{ to } 20°, \Psi) \quad (1);$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad (2); \text{ and}$$

$$(0°\pm10°, [180°-30°(1-(\Psi-90)^2/8100)^{1/2}] \text{ to } 180°, \Psi) \quad (3).$$

7. A filter device comprising:
the first signal end and the second signal end; and
a plurality of acoustic wave resonators including a series arm resonator and a parallel arm resonator; wherein
at least one of the acoustic wave resonators is the acoustic wave device according to claim 1.

8. The filter device according to claim 7, wherein a pass band is n79.

9. A filter device comprising:
the first signal end and the second signal end; and
a plurality of acoustic wave resonators including a series arm resonator and a parallel arm resonator; wherein
at least two of the acoustic wave resonators are each the acoustic wave device according to claim 1; and
the slant angle α is different between at least two of the acoustic wave resonators.

10. The filter device according to claim 9, comprising:
a plurality of the series arm resonators; wherein
the plurality of acoustic wave resonators that differ from each other in the slant angle α are at least two of the series arm resonators.

11. The filter device according to claim 10, wherein the plurality of acoustic wave resonators that differ from each other in the slant angle α are acoustic wave resonators that are divided in series or divided in parallel.

12. The filter device according to claim 9, comprising:
a plurality of the parallel arm resonators; wherein
the plurality of acoustic wave resonators that differ from each other in the slant angle α are at least two of the parallel arm resonators.

13. The filter device according to claim 9, wherein a pass band is n79.

14. An acoustic wave device to be connected between a ground potential and a connection point between a first signal end and a second signal end of a filter device, the acoustic wave device comprising:
a support;
a piezoelectric layer on the support, the piezoelectric layer including an X-axis, a Y-axis, and a Z-axis that are crystal axes and being made of Z-cut lithium niobate; and
an IDT electrode on the piezoelectric layer; wherein
the IDT electrode includes a first busbar and a second busbar that face each other, a plurality of first electrode fingers each including one end connected to the first busbar, and a plurality of second electrode fingers each including one end connected to the second busbar and being interdigitated with the plurality of first electrode fingers;
d/p is less than or equal to about 0.5, where d is a thickness of the piezoelectric layer and p is a center-to-center distance of the first electrode fingers and the second electrode fingers adjacent to each other;
the plurality of first electrode fingers and the plurality of second electrode fingers extend in a direction perpendicular or substantially perpendicular to a direction of the Y-axis of the piezoelectric layer, and a direction in which an envelope extends and the direction of the Y-axis intersect each other, the envelope being an imaginary line connecting tips of the plurality of first electrode fingers; and
|α|<about 9° or about 14°<|α| is satisfied, where |α| is an absolute value of a slant angle α, the slant angle α being an angle of a corner that is defined by the direction in which the envelope extends and the direction of the Y-axis and being an angle other than 0°.

15. The acoustic wave device according to claim 14, wherein
the support includes a cavity portion that is open on a side of the piezoelectric layer; and
at least a portion of the IDT electrode overlaps the cavity portion in plan view.

16. The acoustic wave device according to claim 14, further comprising:
an acoustic reflection film between the support and the piezoelectric layer; wherein
the acoustic reflection film includes at least one low-acoustic-impedance layer having a relatively low acoustic impedance and at least one high-acoustic-impedance layer having a relatively high acoustic impedance, the low-acoustic-impedance layer and the high-acoustic-impedance layer being alternately laminated on each other.

17. The acoustic wave device according to claim 14, wherein d/p is less than or equal to about 0.24.

18. The acoustic wave device according to claim 14, wherein MR≤about 1.75(d/p)+0.075 is satisfied, where MR is a metallization ratio of the plurality of electrode fingers with respect to an excitation region, the excitation region being a region in which the first electrode fingers and the second electrode fingers adjacent to each other overlap each other when viewed in a direction in which the first electrode fingers and the second electrode fingers face each other.

19. The acoustic wave device according to claim 14, wherein Euler angles ($\phi$, $\theta$, $\Psi$) of lithium niobate of the piezoelectric layer are in a range of following Expression (1), Expression (2), or Expression (3):

$$(0°\pm10°, 0° \text{ to } 20°, \Psi) \quad (1);$$

$$(0°\pm10°, 20° \text{ to } 80°, 0° \text{ to } 60°(1-(\theta-50)^2/900)^{1/2}) \text{ or}$$
$$(0°\pm10°, 20° \text{ to } 80°, [180°-60°(1-(\theta-50)^2/900)^{1/2}] \text{ to } 180°) \quad (2); \text{ and}$$

$$(0°\pm10°, [180°-30°(1-(\Psi-90)^2/8100)^{1/2}] \text{ to } 180°, \Psi) \quad (3).$$

* * * * *